(12) United States Patent
Chang et al.

(10) Patent No.: US 8,902,607 B1
(45) Date of Patent: Dec. 2, 2014

(54) MODULAR ELECTRONIC TESTING APPARATUS AND METHODS

(75) Inventors: Paul Ker Chin Chang, Fremont, CA (US); Cyrille Morelle, Los Altos, CA (US)

(73) Assignee: VeEX Inc., Fremont, CA (US)

( * ) Notice: Subject to any disclaimer, the term of this patent is extended or adjusted under 35 U.S.C. 154(b) by 209 days.

(21) Appl. No.: 13/288,827

(22) Filed: Nov. 3, 2011

(51) Int. Cl.
| | | |
|---|---|---|
| H02B 1/00 | (2006.01) |
| H05K 5/00 | (2006.01) |
| H05K 7/00 | (2006.01) |
| G06F 1/16 | (2006.01) |
| H05K 1/18 | (2006.01) |
| H05K 7/02 | (2006.01) |
| H05K 7/04 | (2006.01) |
| G02F 1/1335 | (2006.01) |
| G02F 1/1333 | (2006.01) |
| G01M 3/00 | (2006.01) |
| G01L 1/00 | (2006.01) |
| H01R 12/00 | (2006.01) |
| H05K 1/00 | (2006.01) |
| H01R 13/64 | (2006.01) |
| H05K 1/14 | (2006.01) |

(52) U.S. Cl.
USPC . 361/788; 361/659; 361/679.01; 361/679.21; 361/679.22; 361/679.23; 361/679.26; 361/679.27; 361/679.28; 361/679.29; 361/679.3; 361/679.41; 361/724; 361/729; 361/735; 361/736; 361/748; 361/761; 361/807; 349/57; 349/58; 349/59; 349/60; 73/52; 73/855; 439/76.1; 439/377

(58) Field of Classification Search
USPC .......... 361/807, 659, 679.01, 679.21, 679.22, 361/679.26, 679.29, 679.41, 724, 735, 805, 361/729, 736, 748, 761, 679.23–679.25, 361/679.27, 679.28, 679.3, 788; 349/56–60; 73/52, 855; 439/76.1, 377
See application file for complete search history.

(56) References Cited

U.S. PATENT DOCUMENTS

| | | | |
|---|---|---|---|
| 5,511,108 A | 4/1996 | Severt et al. | |
| 6,064,721 A | 5/2000 | Mohammadian et al. | |
| 6,742,068 B2 * | 5/2004 | Gallagher et al. | ............ 710/302 |
| 6,891,803 B1 | 5/2005 | Chang et al. | |
| 6,917,595 B2 | 7/2005 | Chang et al. | |
| 7,612,990 B2 * | 11/2009 | Larson et al. | ............ 361/679.21 |
| 2006/0117085 A1 * | 6/2006 | Nagao et al. | ................... 709/203 |

* cited by examiner

Primary Examiner — Anthony Haughton
Assistant Examiner — Zhengfu Feng
(74) Attorney, Agent, or Firm — Sheppard Mullin Richter & Hampton LLP

(57) ABSTRACT

A testing apparatus and method of extending the life of a testing apparatus may comprise a chassis including a case having a testing module receptacle receiving a plurality of testing modules comprising at least one processor module and a plurality of test modules, each having the same physical footprint, including respective racking mechanisms and inter-module interface connectors; and a backplane with connectors connecting with a respective inter-module connector, and bus-work interconnecting the respective modules through the inter-module interface connectors and the backplane connectors. The backplane may comprise a battery and display connector. The chassis may comprise a display mounting receptacle configured to receive a display unit having a display connector configured to interface with the backplane display connector. A battery receptacle may receive a battery unit, such as a rechargeable battery.

20 Claims, 7 Drawing Sheets

MODULAR ELECTRONIC TESTING APPARATUS AND METHODS

FIELD

The disclosed subject matter relates to testing units and more specifically to a modular arrangement for a testing unit and a chassis for implementing the same.

BACKGROUND

Prior testing apparatus may have a display, such as an LCD (which can be a touch screen display) and a processor unit, such as a processor board including a CPU, both built into the basic chassis. This limits the growth/expansion of the testing apparatus, and as a result, they may be rendered obsolete by advancing technology after sometimes only a few years. That is to say, as the display technology, the processor technology, test unit testing block technology, battery technology and the like, or any one of such technologies, improves the old testing apparatus must be discarded or continue to be used at the expense of not taking advantage of the newer technology, such as in the display, CPU, testing circuitry, battery etc.

SUMMARY

Testing apparatus and methods of extending the life of a testing apparatus are disclosed which may comprise a chassis which may include a case having a testing module receptacle configured to receive a plurality of testing modules comprising at least one processor module and a plurality of test modules each having the same physical footprint, including respective racking mechanisms and inter-module interface connectors; and a backplane within the case comprising backplane connectors, each configured to connect with a respective inter-module connector, and bus-work interconnecting the respective modules through the inter-module interface connectors and the backplane connectors.

The testing apparatus chassis may include the backplane further comprising a battery and a display connector. The chassis may comprise a display mounting receptacle in the case configured to receive a display unit having a display connector configured to interface with the backplane display connector. The chassis may further comprise a battery receptacle configured to receive a battery having a battery connector configured to interface with the backplane battery connector.

The testing apparatus chassis may further comprise a module cage within the case comprising at least one separating wall dividing the cage into a plurality of module receiving compartments, each compartment comprising a plurality of module mounting racks. The at least one processor module may comprise a processor unit, a memory and a power supply distribution unit. Each of the plurality of test modules may comprise a test unit and a test unit input/output jack. At least two of the plurality of test modules may comprise a stacked single module. At least two of the plurality of test modules may comprise a side-by-side single module.

The testing apparatus chassis may further comprise an inter-module power supply bus connecting the backplane battery connector to the power supply distribution unit on the processor module and the power supply distribution unit to each of the plurality of test modules. The chassis may further comprise a display bus connecting the display to the processor unit through the backplane display connector and the chassis may further comprise a display bus connecting the display to the backplane display connector. Each of the configuration and positioning of the inter-module interface connectors and the backplane connectors may be standardized for the modules and for the chassis.

A method of extending the useful life of a testing apparatus may comprise providing a testing apparatus chassis comprising a case having a testing module receptacle configured to receive a plurality of testing modules comprising at least one processor module and a plurality of test modules each having the same physical footprint, including respective racking mechanisms and inter-module interface connectors; providing the chassis with a backplane within the case comprising backplane connectors, each configured to connect with a respective inter-module connector, and bus-work interconnecting the respective modules through the inter-module interface connectors and the backplane connectors; and wherein the inter-module interface connectors and the backplane connectors are standardized for the chassis and the modules.

The foregoing presents a simplified summary of the claimed subject matter in order to provide a basic understanding of some aspects of the claimed subject matter, mostly or wholly in the language used in the accompanying claims themselves. This summary is not an extensive overview of the claimed subject matter. It is intended to neither identify key or critical elements of the claimed subject matter nor delineate the scope of the claimed subject matter. Its sole purpose is to present the concepts of the claimed subject matter in a simplified form for purposes of understanding the concepts of the claimed subject matter. Many other features and embodiments of the present invention will be apparent from the accompanying drawings and from the following detailed description.

BRIEF DESCRIPTION OF THE DRAWINGS

For a more complete understanding of the present invention, reference is made to the following detailed description of exemplary embodiments considered in conjunction with the accompanying drawings, in which.

DETAILED DESCRIPTION OF THE EXEMPLARY EMBODIMENTS

Figure 1:
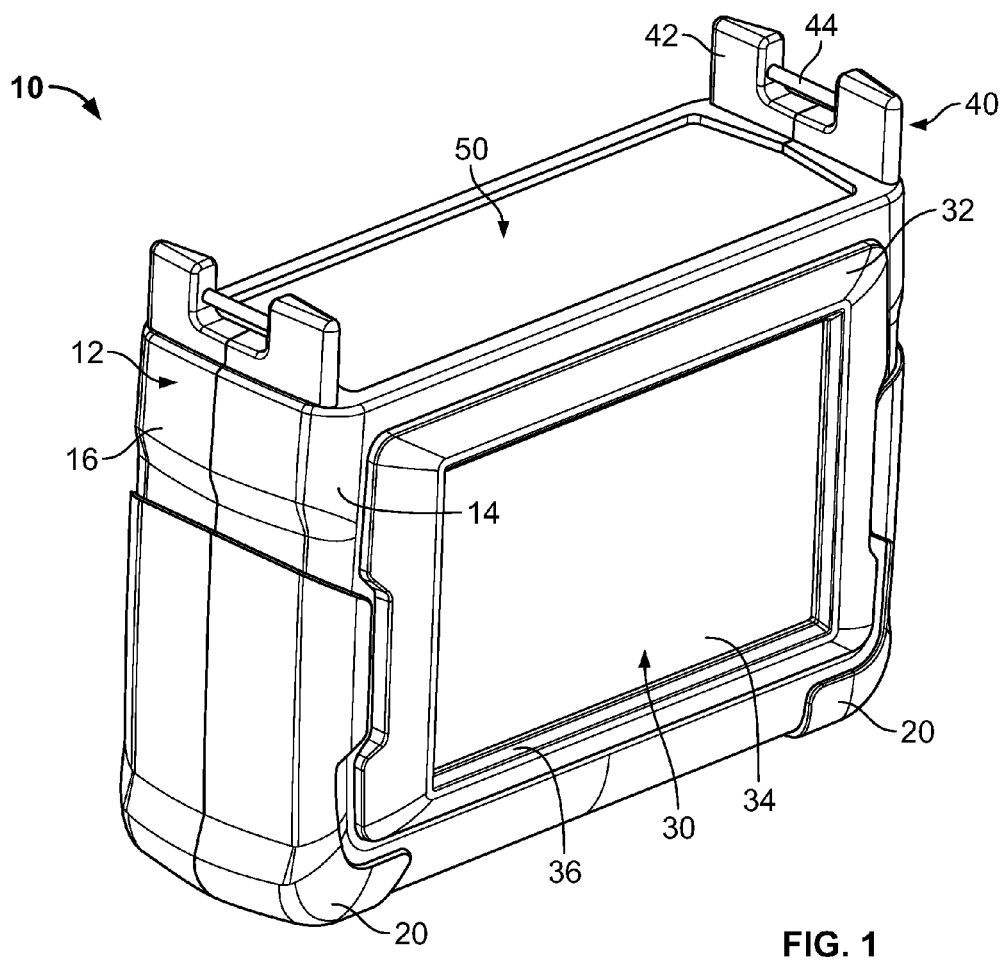
FIG. 1 shows an isotropic view of an example of a chassis for a modular electronic testing apparatus according to an embodiment of the disclosed subject matter.

The following presents a disclosure of at least one embodiment of the disclosed and claimed subject matter in order to provide a basic understanding of some aspects of the claimed subject matter. The following description and the accompanying drawings set forth in detail certain illustrative aspects of the claimed subject matter. These aspects are indicative, however, of but one or more of the various ways in which the principles of the claimed subject matter may be employed and the disclosed subject matter is intended to include all such aspects and their equivalents. Other advantages and novel features of the claimed subject matter will become apparent from the following detailed description of at least one embodiment of the claimed subject matter when considered in conjunction with the drawings.

The claimed subject matter is now described with reference to the drawings, wherein like reference numerals are used to refer to like elements throughout. In the following description. For purposes of explanation, numerous specific details are set forth in order to provide a thorough understanding of the claimed subject matter. It will also be evident, however, that the claimed subject matter may be practiced without these specific details. In some instances, well-known structures and devices are shown in block diagram form in order to facilitate describing the claimed subject matter.

It will also be understood that the elements disclosed and illustrated in the drawing figures are described in a positional and relational sense in the present application, e.g., as "top" and "bottom," "front" and "rear," "left" and "right" in such nomenclature selected purely arbitrarily. such nomenclature is selected to be in conformance with the illustrated relationships in the drawing figures. The nomenclature is not intended to delimit any such orientation of the subject matter disclosed when in actual use, or to so limit the appended claims.

Referring now to FIG. 1 there is shown an isotropic view of an example of a chassis 10 for a modular electronic testing apparatus according to an embodiment of the disclosed subject matter. The chassis 10 may have a chassis case shell 12, which may include a chassis case shell top half 14 and a chassis case shell bottom half 16, each of which may be made from any suitable moldable rigid material, such as poly ethylene plastic. The chassis 10 may have a pair of corner bumpers 20, made from any suitable material, e.g., rubber or soft plastic.

The testing apparatus may further include a display unit 30 mounted on the chassis 10, such as by being attached, e.g., with screws or the like (not shown) or being snap-fit into the chassis 10. The display unit 30 may include a display unit frame 32, a display unit display screen 34 and a display unit display screen seal 36. The display 32 may be an LCD or other suitable display screen technology and may include a touchscreen capability. The testing apparatus may further include a hand strap (not shown) or shoulder strap (not shown) strap mounting unit 40, which may include a strap mounting U-shaped stanchion 42 and a strap holding pole 44. The chassis 10 may also have a chassis case 12 front-side module insertion opening 50.

Figure 2A:
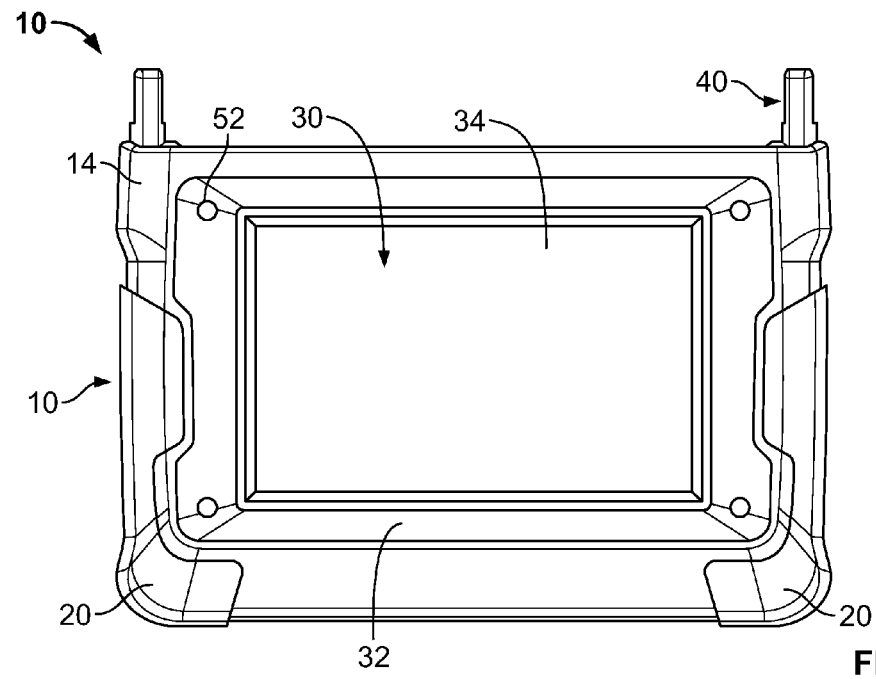
FIGS. 2A and 2B show, respectively a top view and a bottom view of the chassis of FIG. 1 for a modular electronic testing apparatus according to an embodiment of the disclosed subject matter.
Figure 2B:
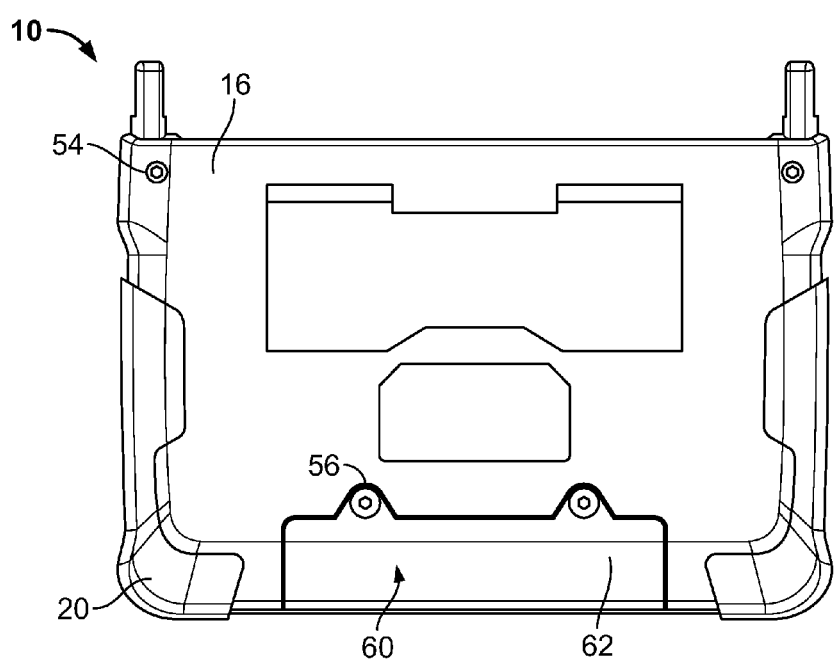

Referring now to FIGS. 2A and 2B there is shown, respectively a top view and a bottom view of the chassis 10 of FIG. 1 for a modular electronic testing apparatus according to an embodiment of the disclosed subject matter. FIG. 2A shows, e.g., a plurality of display unit screws 52 that hold the display unit 30 together and may also serve to hold the display unit 30 in place in a display unit 30 display receiving recess 38 (shown in FIG. 4). As is shown in FIG. 2B a plurality of case screws 54, each of which passes through a respective case screw housing 58 (Shown in FIG. 4), can serve to connect the case 12 front half 14 and back half 16. Also shown are a pair of holding screws 56 which hold a battery unit 60 (shown in FIGS. 4 and 5) battery cover panel 62 in place within a battery slot 64 (shown in FIGS. 4 and 5).

Figure 3A:
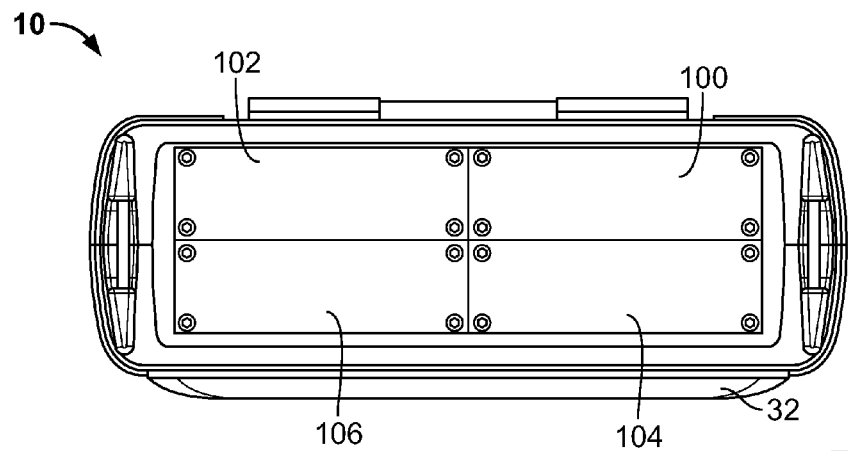
FIGS. 3A and 3B show, respectively a front view and a back view of the chassis of FIG. 1 for a modular electronic testing apparatus according to an embodiment of the disclosed subject matter.
Figure 3B:
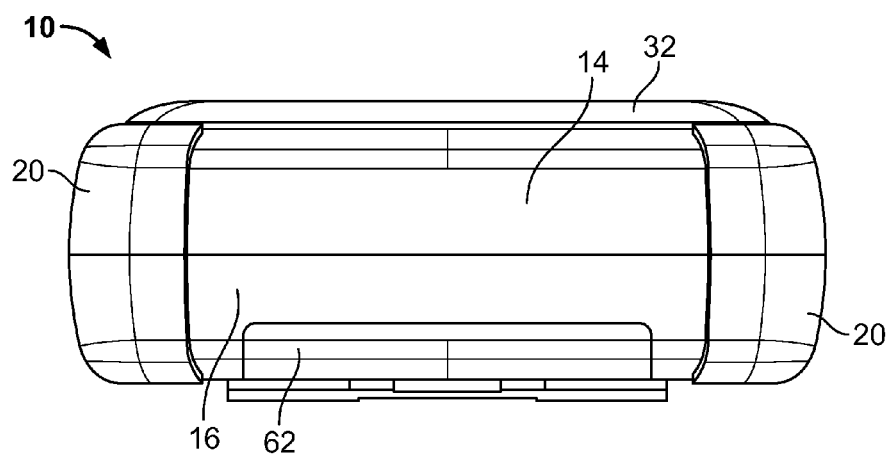

Turning now to FIGS. 3A and 3B there is shown, respectively a front view and a back view of the chassis 10 of FIG. 1 for a modular electronic testing apparatus according to an embodiment of the disclosed subject matter. FIG. 3A shows, as an example, a plurality of four modules inserted into the chassis case 12 front module insertion opening 50, e.g., CPU module 100 and test module 102, 104 and 106. It will be understood that the testing apparatus chassis 10 can be configured to receive more than four modules and, as explained further below, less than four modules, but in the same opening 50 as shown in FIG. 3A.

Figure 4:
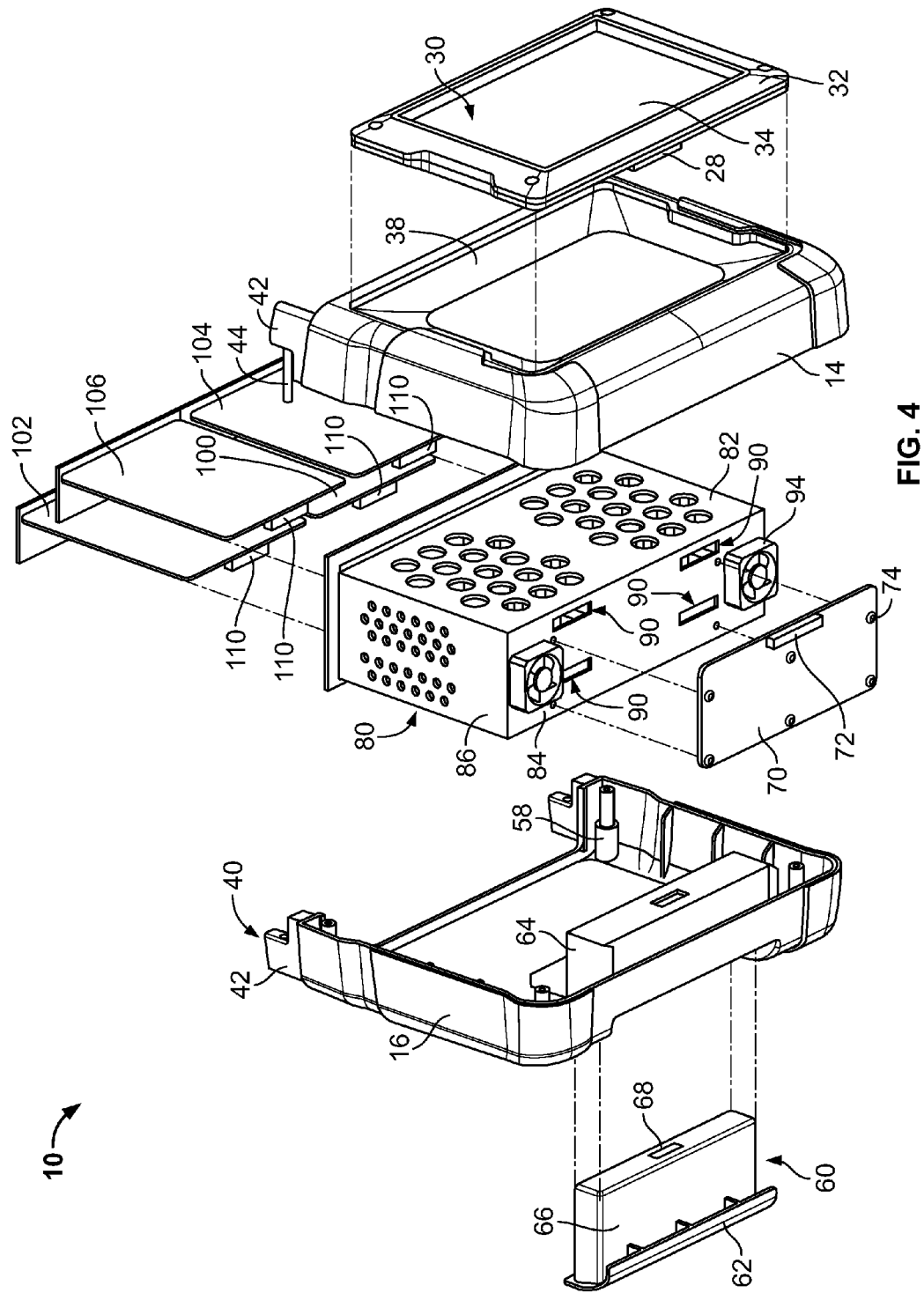
FIG. 4 shows an exploded isotropic view of the chassis of FIG. 1 from the perspective of the top and rear of the chassis according to an embodiment of the disclosed subject matter.
Figure 5:
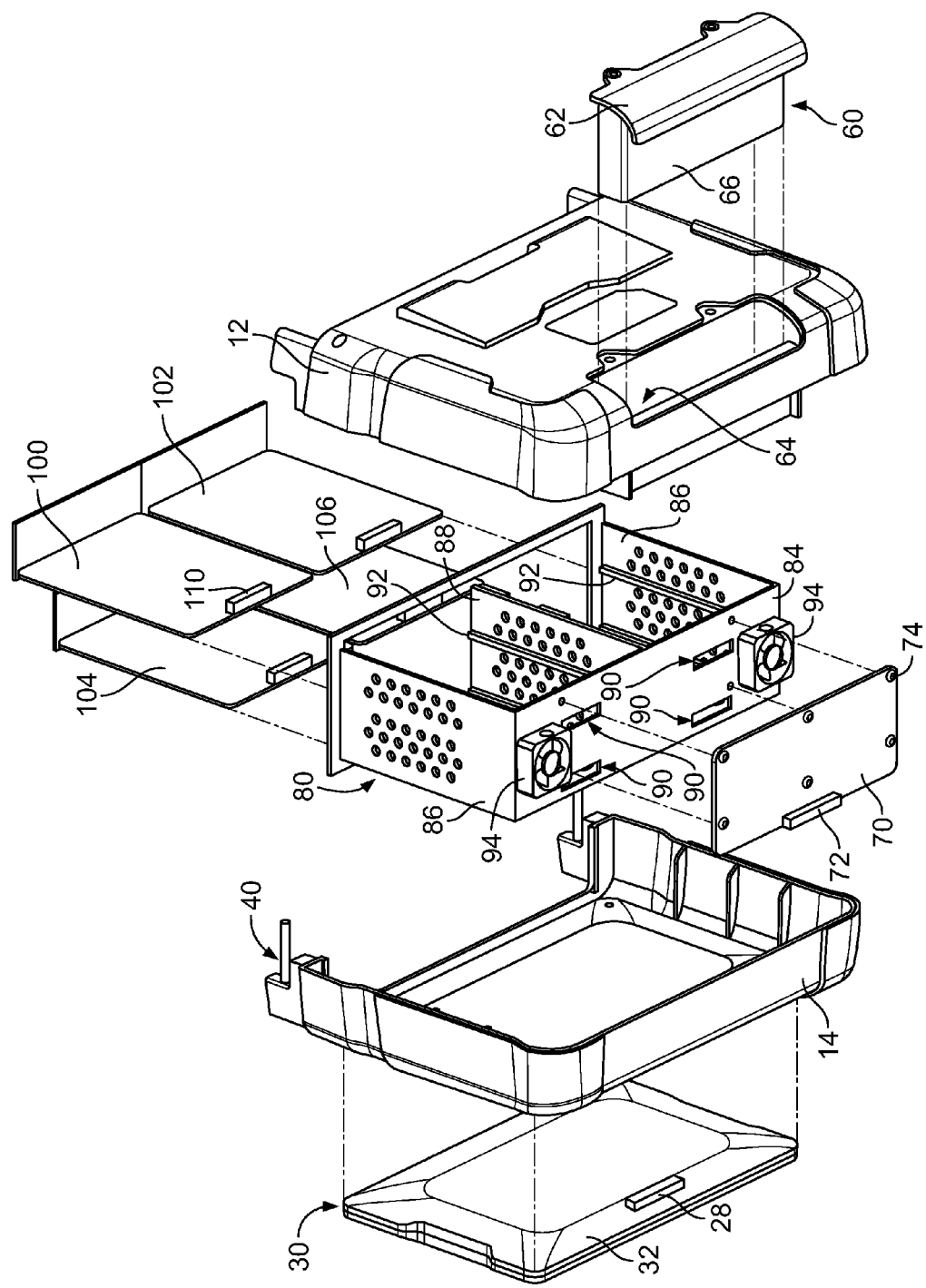
FIG. 5 shows an exploded isotropic view of the chassis of FIG. 1 from the perspective of the bottom and rear of the chassis according to an embodiment of the disclosed subject matter.

Turning now to FIGS. 4 and 5, in FIG. 4 there is shown an exploded isotropic view of the chassis 10 of FIG. 1 from the perspective of the top and rear of the chassis 10 according to an embodiment of the disclosed subject matter, and in FIG. 5 there is shown an exploded isotropic view of the chassis 10 of FIG. 1 from the perspective of the bottom and rear of the chassis 10 according to an embodiment of the disclosed subject matter.

There is shown in some further detail the contents of the chassis 10 of the modular testing apparatus of the disclosed subject matter. For example, the display unit 30 is shown to have a display unit connector 28. The display unit 30 may be an LCD display, e.g., an insertable (snap-fitted) LCD and keypad (not shown) module 30. The battery unit 60 is shown to have a battery 66, which may be a 2×2 —4 cell LiIon rechargeable battery, or a 3×2 —6 cell LiIon battery, by way of example, having sufficient power output to drive the display unit 30 and CPU 120 and memory 122 (shown in FIG. 6) and the like. The battery 66 may have a battery connector 68.

The chassis 10 may have a backplane 70, with a backplane battery and display connector 72, and may be held to a back wall 84 of a module receiving cage 80 by a plurality of backplane mounting screws 74. The backplane 70 may have a plurality of backplane module connectors 76 (shown in FIGS. 6 and 7).

Internal to the chassis 10 may be contained a module mounting cage 80, having a cage top 82, a cage back wall 84, cage side walls 86 and a cage center separation wall 88, with the wall opposite to the top 82 open, as illustrated in FIG. 5. The back wall 84 may have a plurality of module connector openings 90 for the backplane module connectors 76 (shown in FIG. 7 schematically) to pass through in order to connect to a respective inter-module power/communication link interface connector 126 (shown in FIG. 6) as part of a respective module connector 110 (shown in FIG. 7). The cage side walls 86 and center separation wall 88 may have a plurality of grooved module slot mounting brackets 92. The cage 80 may also serve to mount cooling fans 94, e.g., a cooling fan 94 with an ear cover and an air vent at the bottom.

FIGS. 4 and 5 also show the orientation of modules slideably mounted in the cage 8, such as a processor module 100 and a plurality of tester modules 102, 104 and 105. That is, the modules 100, 102, 104 and 106, e.g., in the form of circuitry and interconnections mounted on a printed circuit board, may be inserted into a respective slot by engaging the sides of the printed circuit board in the grooves of the grooved module slot mounting brackets 92. Some or all of the modules 100, 102, 104, and 106 may be circuit boards with on-board electronic components, such as a CPU 120 on the processor board 100 and memory chips as part of the memory 122, interconnected by printed circuit board interconnect wiring. Alternatively, as another example, the module 100, 102, 104 or 106 circuitry may be partly or completely enclosed in a module housing (not shown) with protrusions on the sides to insert into the respective grooved module slot mounting brackets 92.

Figure 6:
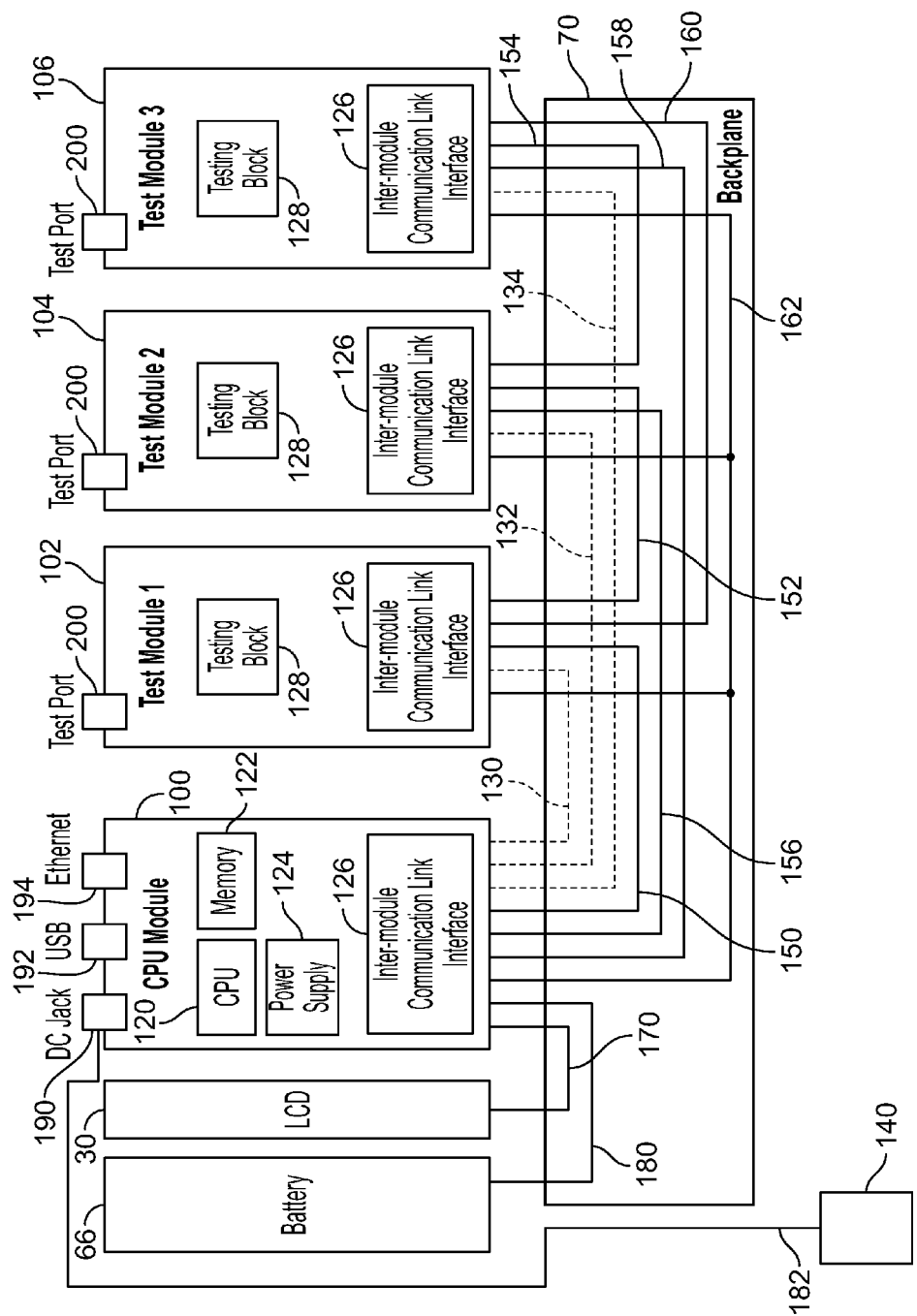
FIG. 6 shows a schematic view of an example of the interconnection of various elements of the modular testing apparatus according to an embodiment of the disclosed subject matter; and, FIG. 7 shows a schematic view of an example of the interconnection of various elements of the modular testing apparatus according to an embodiment of the disclosed subject matter.
Figure 7:
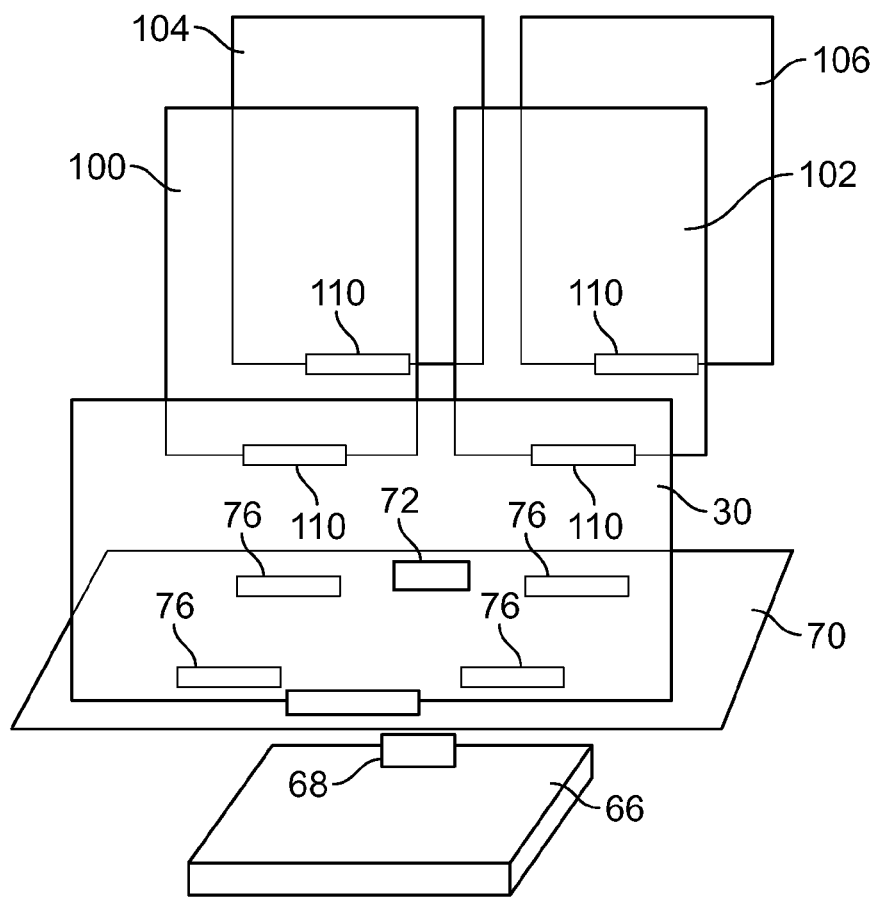

Turning now to FIGS. 6 and 7, there are shown schematic views of an example of the interconnection of various elements of the modular testing apparatus according to an embodiment of the disclosed subject matter. The modular testing apparatus may have a processor module 100, such as a removable CPU module 100, which may include a CPU 120, a memory 122 and a power supply and distribution unit 124. The removable CPU module 100 may operate, e.g., as a 2xUSB host and a 1xUSB client, through USB connection 192 and may also include a 10/100-T Ethernet connection 194. The CPU module 100 may have an SD card (not shown), which may include a built in WiFi and/or Bluetooth connection. For low cost IPod or NB remote control, a micro-controller (not shown), e.g., with a USB interface may be used in lieu of the CPU 120.

As illustrated here there are three test modules, 102, 104 and 106, i.e., three plug in test modules insertable into one of a respective test module slot, e.g., using the mounting brackets 92. Modules 102 and 106 can be a dual stack comprising a single module (not shown), also slideably mounted in the cage 80 by protrusions engaging the one or more of the pairs of grooved brackets 92 on a side wall 86 and center wall 88. Modules 104 and 106, or 100 and 102, can be a dual side by side module comprising a single module (not shown), slideably mounted in the cage 80 by protrusions engaging grooved brackets 92 on the respective side walls 86 of the cage 80, with part or all of the center wall 86 removed to accommodate the single side-by-side module (not shown).

Each of the modules 100, 102, 104 and 106 may have a module connector 110 (Shown in FIG. 7) which may comprise or include as a part thereof each respective inter-module communication link interface 126 for the module. Each testing module 102, 104 and 106 may have a test block 128 to interface the test module between the apparatus being tested and the CPU 120.

The backplane 70 may include a control link 130 between the processor module 100 and module 102, a control link 132 between the processor module 100 and test module 104 and a control link 134 between the processor module 100 and test module 106, each of which may be, e.g., an internal USB, serial and/or I2C control link. The backplane may also include an inter-module communications link 150 between the processor module 100 and test module 102, an inter-module communications link 152 between test module 102 and test module 104, an inter-module communications link 154 between test module 104 and test module 106, and so forth for inter-module communications link 156 (100-104), inter-module communications link 158 (100-106) and inter-module communications link 160 (102-106). An internal Ethernet capability can be utilized for inter-module communication, e.g., at a1000-T capacity.

A display link 170 on the backplane 70 connects the display unit 30 to the processor board 102, e.g., for control and power. A battery link 180 connects the processor board 100 and the resident power supply distribution unit 124 interface connector, and the battery 66. An AC/DC converter 140 can charge the battery 66 when in the battery slot 64 through a charging link 182 connected to the DC Jack 190 on the processor module 100 and through the power supply distribution unit 124. Power can also be distributed over the backplane 70 from the power distribution supply 124 on the CPU board 100 over a system power connection 162.

The processor board 100 can include external interface connectors, such as a DC jack 190, a USB jack 192 and an Ethernet jack 194. The test modules 102, 104 and 106 may have an external interface connector such as a test port 200 for connection to the apparatus being tested.

The modules 100, 102, 104 and 106 can be quite compact, e.g., with about a 28 mm height (thickness/clearance), 120 mm width, 140 mm depth. This can allow for the testing apparatus chassis 10 to be about 70 mm thick, 280 mm wide and 160 mm deep, without the display unit 30 and 80 mm thick with the display 30 attached.

It will be understood by those skilled in the art that a modular testing apparatus and method of extending the life of a modular testing apparatus is disclosed which may comprise a chassis which may include a case having a testing module receptacle configured to receive a plurality of testing modules comprising at least one processor module and a plurality of test modules each having the same physical footprint, including respective racking mechanisms and inter-module interface connectors; and a backplane within the case comprising backplane connectors, each configured to connect with a respective inter-module connector, and bus-work on the backplane, i.e., electrical connections interconnecting, among other things, the respective modules through the inter-module interface connectors and the backplane connectors.

As illustrated the testing module receptacle has four module slots, but could have more or less. The modules can occupy individual slots, or two or more adjacent slots, as appropriate and necessary. The modules can have a standardized configuration, i.e., the shape and size of the modules are the same, the engagement with the mounting brackets, such as the illustrated grooved mounting brackets, i.e., mounting racks, are the same. The positioning and type of connectors to interface with the backplane are the same, etc. All of these may be dictated by the configuration of the chassis, size, shape, backplane configuration and the like but the standardization remains so as to make modules essentially interchangeable in the chassis cage slots.

This may vary slightly for the CPU module, for reasons of the need to connect the CPU module power supply distribution unit to the battery and the display to CPU module power supply distribution unit, although these connections could also be accomplished, as will be understood by those skilled in the art with a standardized connector from the CPU unit and through the backplane, such that all modules, test and processor modules, are standardized. That is they have, at a minimum, the same footprint, shape, connector arrangements and mounting as to be interchangeable from slot to slot in the mounting cage of the chassis.

The testing module chassis may include the backplane further comprising a display connector. The chassis may comprise a display mounting receptacle in the case configured to receive a display unit having a display connector configured to interface with the backplane display connector. The chassis may further comprise a battery receptacle configured to receive a battery unit.

The testing chassis may further comprise a module cage within the case comprising at least one separating wall dividing the cage into a plurality of module receiving compartments, each compartment comprising a plurality of module mounting racks, which may include the mounting brackets as discussed above as the mounting racking mechanisms. The at least one processor module may comprise a processor unit, a memory and a power supply distribution unit. Each of the plurality of test modules may comprise a test unit and a test unit input/output jack. At least two of the plurality of test modules may comprise a stacked single module. At least two of the plurality of test modules may comprise a side-by-side single module.

The testing module chassis may further comprise an inter-module power supply bus connecting the backplane battery connector to the power distribution unit on the processor module and the power distribution unit to each of the plurality of test modules. The chassis may further comprise a display bus connecting the display to the processor unit through the backplane display connector and the chassis may further comprise a display bus connecting the display through the backplane display connector.

A method of extending the useful life of a testing apparatus may comprise providing a testing module chassis comprising a case having a testing module receptacle configured to receive a plurality of testing modules comprising at least one processor module and a plurality of test modules each having the same physical footprint, including respective racking mechanisms and inter-module interface connectors; providing the chassis with a backplane within the case comprising backplane connectors, each configured to connect with a respective inter-module connector, and bus-work interconnecting the respective modules through the inter-module interface connectors and the backplane connectors; and wherein the inter-module interface connectors and the backplane connectors are standardized for the chassis and the modules.

Those skilled in the art will understand that the testing apparatus of the claimed subject matter has a number of advantages over the existing art. The claimed subject matter includes a testing platform that allows expansion into the future because all modules can be replaced, including the battery, LCD, and CPU module and the test modules. The test modules and perhaps also the CPU module, and/or combinations of these, are also interchangeable from slot to slot. The backplane of the testing apparatus contains several commonly used communication channels between test modules and from test modules to the CPU module, with the positioning, and footprint, i.e., size and shape, as well connector type(s), being the same for each module, with the possible exception of additional connections for the CPU module, as noted above. In any event, as battery technology improves a new more advanced battery may be substitute into the testing apparatus. The same is true for the display and for the CPU module, as well as for the individual or combination testing modules.

Depending on the application of the testing apparatus or a given testing module if an external PC (e.g. notebook PC) is used, the LCD module may not be needed. The CPU module can be a low cost one that supports the communication between the testing apparatus and the PC (e.g. USB, WiFi, or Bluetooth). If the unit is a standalone one, the LCD and a more powerful CPU module can be used. The testing apparatus can accommodate multiple test modules. In this design, as noted above in respect to the illustrated example chassis, i.e., three standard size test modules can be accommodated, or, 1 standard test module and 1 double width test module, or, 1 double height test module with 1 standard size test module.

In the foregoing specification, the disclosed subject matter has been described with reference to at least one specific exemplary embodiment thereof. It will be evident that various modifications may be made thereto without departing from the broader spirit and scope of the disclosed and claimed subject matter as set forth in the following claims. All such variations and modifications are intended to be included within the scope of the invention. The specification and drawings are, accordingly, to be regarded in an illustrative sense rather than a restrictive sense.

We claim:

1. A testing apparatus chassis comprising:
   a case having a testing module receptacle configured to receive a plurality of testing modules comprising at least one removable processor module and a plurality of interchangeable test modules, each interchangeable test module comprising a test unit and a test unit input/output jack and each interchangeable test module having a same physical footprint, including respective racking mechanisms and inter-module interface connectors; and
   a backplane within the case, the backplane comprising backplane connectors, each backplane connector configured to connect with a respective inter-module interface connector of the inter-module interface connectors, and the backplane comprising bus-work interconnecting the respective interchangeable test modules through the inter-module interface connectors and the backplane connectors;
   wherein the backplane further comprises a backplane battery connector.

2. The testing apparatus chassis of claim 1 wherein the backplane further comprises a backplane display connector.

3. The testing apparatus chassis of claim 2 further comprising:
   a display mounting receptacle in the case configured to receive a display unit having a connector configured to interface with the backplane display connector.

4. The testing apparatus chassis of claim 1 further comprising:
   a battery receptacle configured to receive a battery unit having a connector configured to interface with the backplane battery connector.

5. The testing apparatus chassis of claim 4 wherein the battery unit comprises a rechargeable battery.

6. The testing apparatus chassis of claim 1 further comprising:
   a module cage within the case comprising at least one separating wall dividing the cage into a plurality of module receiving compartments, each compartment comprising a plurality of module mounting racks.

7. The testing apparatus chassis of claim 1 wherein the at least one removable processor module comprises a processor unit, a memory and a power supply distribution unit.

8. The testing apparatus chassis of claim 1 wherein each of the plurality of interchangeable test modules comprises an external interface connection for connection to an apparatus being tested.

9. The testing apparatus chassis of claim 1 wherein at least two of the plurality of interchangeable test modules comprise a stacked single module.

10. The testing apparatus chassis of claim 1 wherein at least two of the plurality of interchangeable test modules comprise a side-by-side single module.

11. The testing apparatus chassis of claim 7 further comprising:
    an inter-module power supply bus connecting the backplane battery connector to the power supply distribution unit on the at least one removable processor module and connecting the power supply distribution unit to each of the plurality of interchangeable test modules.

12. The testing apparatus chassis of claim 7 further comprising:
    a display bus connecting a display unit to the processor unit.

13. The testing apparatus chassis of claim 3 further comprising:
a display bus connecting the display unit through the backplane display connector.

14. The testing apparatus chassis of claim 1 wherein each of configuring and positioning the inter-module interface connectors and the backplane connectors is standardized for the modules and for the chassis.

15. The testing apparatus chassis of claim 3 wherein each of configuring and positioning the inter-module interface connectors and the backplane connectors is standardized for the chassis.

16. The testing apparatus chassis of claim 2 wherein each of configuring and positioning the backplane display connector and the backplane battery connector is standardized for the chassis.

17. The testing apparatus chassis of claim 14 further comprising:
a module cage within the case comprising at least one separating wall dividing the cage into a plurality of module receiving compartments, each compartment comprising a plurality of module mounting racks and wherein mounting the plurality of interchangeable test modules on the plurality of mounting racks is standardized for the chassis and for each interchangeable test module of the plurality of interchangeable test modules.

18. The testing apparatus chassis of claim 15 further comprising:
a module cage within the case comprising at least one separating wall dividing the cage into a plurality of module receiving compartments, each compartment comprising a plurality of module mounting racks and wherein mounting the plurality of interchangeable test modules on the plurality of mounting racks is standardized for the chassis and for each interchangeable test module of the plurality of interchangeable test modules.

19. The testing apparatus chassis of claim 16 further comprising:
a module cage within the case comprising at least one separating wall dividing the cage into a plurality of module receiving compartments, each compartment comprising a plurality of module mounting racks and wherein mounting the plurality of interchangeable test modules on the plurality of mounting racks is standardized for the chassis and for each interchangeable test module of the plurality of interchangeable test modules.

20. A method of extending a useful life of a testing apparatus comprising:
providing a testing module chassis comprising a case having a testing module receptacle configured to receive a plurality of testing modules comprising at least one removable processor module and a plurality of interchangeable test modules, each interchangeable test module comprising a test unit and a test unit input/output jack and each interchangeable test module having a same physical footprint, including respective racking mechanisms and inter-module interface connectors;
providing the chassis with a backplane within the case, the backplane comprising backplane connectors, each backplane connector configured to connect with a respective inter-module interface connector of the inter-module interface connectors, and the backplane comprising buswork interconnecting the respective interchangeable test modules through the inter-module interface connectors and the backplane connectors;
wherein the inter-module interface connectors and the backplane connectors are standardized for the chassis and the modules;
wherein the backplane further comprises a backplane battery connector.

* * * * *